United States Patent
Vaidya et al.

(10) Patent No.: US 11,841,396 B1
(45) Date of Patent: Dec. 12, 2023

(54) UNITED STATES TEST CONTROLLER FOR SYSTEM-ON-CHIP VALIDATION

(71) Applicant: Marvell Asia Pte Ltd, Singapore (SG)

(72) Inventors: Sameer Vaidya, Campbell, CA (US); Supaket Katchmart, San Jose, CA (US); Vivek Khanzode, Sunnyvale, CA (US); Pallavi Joshi, Milpitas, CA (US); Henri Sutioso, Saratoga, CA (US); Naim Siemsen-Schumann, Fremont, CA (US); Hongying Sheng, San Jose, CA (US)

(73) Assignee: Marvell Asia Pte Ltd, Singapore (SG)

( * ) Notice: Subject to any disclaimer, the term of this patent is extended or adjusted under 35 U.S.C. 154(b) by 4 days.

(21) Appl. No.: 17/655,706

(22) Filed: Mar. 21, 2022

Related U.S. Application Data

(60) Provisional application No. 63/304,355, filed on Jan. 28, 2022, provisional application No. 63/164,333, filed on Mar. 22, 2021.

(51) Int. Cl.
*G01R 31/317* (2006.01)
*G01R 31/3177* (2006.01)

(52) U.S. Cl.
CPC ... *G01R 31/31701* (2013.01); *G01R 31/3177* (2013.01); *G01R 31/31724* (2013.01)

(58) Field of Classification Search
None
See application file for complete search history.

(56) References Cited

U.S. PATENT DOCUMENTS

| | | | |
|---|---|---|---|
| 9,323,538 B1* | 4/2016 | Blunno | G06F 9/44 |
| 10,395,691 B1* | 8/2019 | Maung | G11B 20/1816 |
| 11,200,961 B1* | 12/2021 | Uribe | G11C 29/44 |
| 2001/0056511 A1* | 12/2001 | Nemazie | G06F 3/0626 |
| | | | 710/74 |
| 2006/0111889 A1* | 5/2006 | Bress | G06F 11/261 |
| | | | 703/23 |
| 2007/0091497 A1* | 4/2007 | Mizuno | G11B 20/1816 |
| | | | 714/E11.163 |

(Continued)

OTHER PUBLICATIONS

Boyd et al., "Method and Hardware for the Comprehensive Functional Testing of Interface Controller and Support Circuitry", Jan. 1, 1988, TDB 01-88 p. 276-281, IP.com No. IPCOM000056675D (Year: 1988).*

*Primary Examiner* — Daniel F. McMahon

(57) ABSTRACT

A storage device controller includes drive controller circuitry configured to control writing and fetching of data from a storage medium, read data channel circuitry for interfacing between the drive controller circuitry and the storage medium, test controller circuitry configured to test the read data channel circuitry by issuing test commands simulating the writing and fetching of data from the storage medium, and selector circuitry configured to switchably couple the read data channel circuitry to the drive controller circuitry in an operating mode and to the test controller circuitry in a testing mode. The storage device controller may include a pattern generator configured to output the test commands. Processor circuitry may be configured to store test results in memory, to compute performance metrics from the stored test results, and communicate the performance metrics to a host device.

20 Claims, 5 Drawing Sheets

(56) References Cited

U.S. PATENT DOCUMENTS

| | | | |
|---|---|---|---|
| 2009/0138768 A1* | 5/2009 | Pyeon | G11C 29/025 |
| | | | 714/E11.002 |
| 2010/0157765 A1* | 6/2010 | Emo | G11B 5/59622 |
| | | | 369/53.31 |
| 2021/0271414 A1* | 9/2021 | Spica | G06F 3/0659 |
| 2022/0091776 A1* | 3/2022 | Shin | G06F 3/0673 |

* cited by examiner

UNITED STATES TEST CONTROLLER FOR SYSTEM-ON-CHIP VALIDATION

CROSS REFERENCE TO RELATED APPLICATIONS

This disclosure claims the benefit of copending, commonly-assigned U.S. Provisional Patent Applications Nos. 63/164,333 and 63/304,355, filed Mar. 22, 2021 and Jan. 28, 2022, respectively, each of which is hereby incorporated by reference herein in its respective entirety.

FIELD OF USE

This disclosure relates to a system-on-chip having a built-in test controller. More particularly, this disclosure relates to a system-on-chip, such as a storage device controller, having an onboard test controller to eliminate the need for a separate validation device, and to allow more complete testing of system components.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuit devices are commonly tested—or "validated"—after fabrication, to make certain that, e.g., the design of the integrated circuit device functions as intended and that there were no processing defects during fabrication. When the integrated circuit device is used as part of a system-on-chip (SoC), the validation may be performed after the integrated circuit device has been incorporated into the SoC, typically using an external validation system. However, while normal functioning of the SoC involves interaction between the integrated circuit device and other devices on the SoC, typical external validation systems test only the integrated circuit device itself, and not the integrated circuit device in combination with other devices on the SoC.

SUMMARY

In accordance with implementations of the subject matter of this disclosure, a storage device controller includes drive controller circuitry configured to control writing and fetching of data from a storage medium, read data channel circuitry for interfacing between the drive controller circuitry and the storage medium, test controller circuitry configured to test the read data channel circuitry by issuing test commands simulating the writing and fetching of data from the storage medium, and selector circuitry configured to switchably couple the read data channel circuitry to the drive controller circuitry in an operating mode and to the test controller circuitry in a testing mode.

A first implementation of such a storage device controller may include a pattern generator configured to output the test commands, and data pump circuitry configured to transfer data to and from the read data channel circuitry.

According to a first aspect of that first implementation, the storage device controller may further include processor circuitry configured to create instructions for the test commands.

In one instance of that first aspect, the processor circuitry may be configured to store the instructions for the test commands in memory accessible to the test controller circuitry.

A first variant of that one instance may further include onboard memory configured to store the instructions.

In a second variant of that one instance, the processor circuitry may be configured to store the instructions for the test commands in memory that is external to the storage device controller.

A third variant of that one instance may further include a bus, wherein at least the read data channel circuitry, the test controller circuitry, the processor circuitry and the memory are coupled to the bus.

That third variant may further include a serial interface coupled to the bus, for communicating with a host device. In such a case, the processor circuitry may be configured to store test results in the memory. Moreover, the processor circuitry may be configured to compute performance metrics from the stored test results, and communicate the performance metrics to the host device.

According to implementations of the subject matter of this disclosure, a method for testing a read data channel of a storage device controller, where the storage device controller includes drive controller circuitry configured to control writing and fetching of data from a storage medium, the read data channel circuitry for interfacing between the drive controller circuitry and the storage medium, and test controller circuitry configured to test the read data channel circuitry by issuing test commands simulating the writing and fetching of data from the storage medium, includes coupling a source of test data signals to the read data channel, and switchably coupling the read data channel circuitry to the test controller circuitry in place of the drive controller circuitry to test execution by the read data channel of the test commands on the test data signals.

In a first implementation of such a method, switchably coupling the read data channel circuitry to the test controller circuitry in place of the drive controller circuitry may include inputting a control signal to selector circuitry that is coupled to the read data channel circuitry, the test controller circuitry, and the drive controller circuitry.

A second implementation of such a method may further include sending a trigger signal from the source of test signals to the test controller circuitry to indicate presence of the test signals.

A third implementation of such a method may include generating test commands in a pattern generator of the test controller circuitry, and inputting the test commands to the read data channel.

According to an aspect of that third implementation, generating the test commands may include creating instructions for the test commands in processor circuitry of the storage device controller.

One instance of that aspect of the third implementation may include storing the instructions for the test commands in memory accessible to the test controller circuitry.

In a first variant of that instance, storing the instructions for the test commands may include storing the instructions for the test commands in onboard memory of the storage device controller.

In a second variant of that instance, storing the instructions for the test commands may include storing the instructions for the test commands in memory that is external to the storage device controller.

A third variant of that instance may further include storing test results in the memory.

One case of that third variant may further include computing performance metrics from the stored test results, and communicating the performance metrics to a host device.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
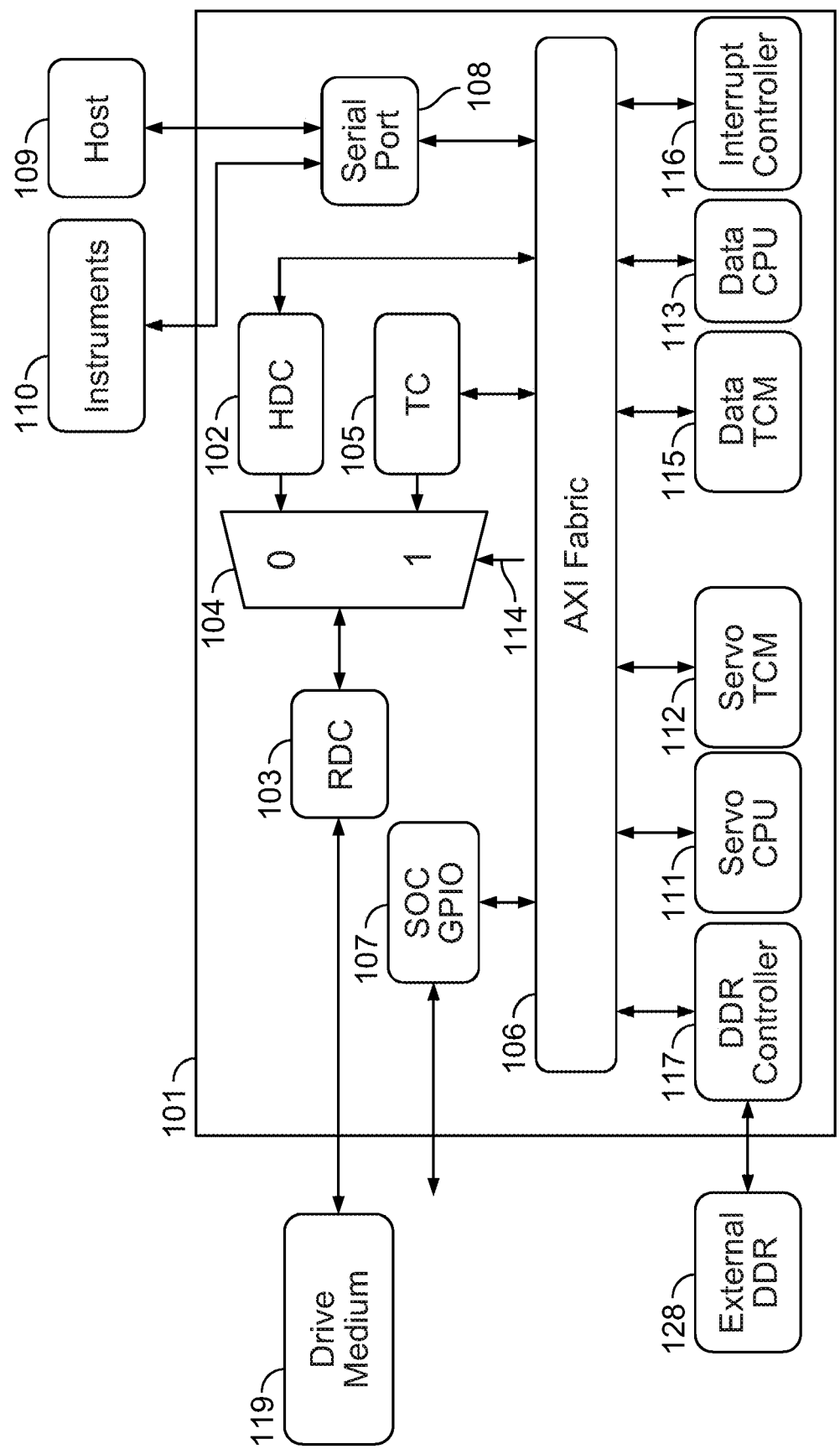
FIG. 1 illustrates a drive controller system-on-chip which may be used in accordance with implementations of the subject matter of this disclosure.

As noted above, integrated circuit devices are commonly validated after fabrication, to make certain that the design of the integrated circuit device functions as intended and that there were no processing defects during fabrication. When the integrated circuit device is used as part of an SoC, the validation may be performed after the integrated circuit device has been incorporated into the SoC, typically using an external validation system. However, while normal functioning of the SoC involves interaction between the integrated circuit device and other devices on the SoC, typical external validation systems test only the integrated circuit device itself, and not the integrated circuit device in combination with other devices on the SoC.

For example, a controller for a storage device such as a hard disk drive may include an SoC having read data channel (RDC) circuitry, controller circuitry for interfacing with the hard disk storage medium itself (e.g., through the RDC circuitry) to control the actual writing and fetching of data, and one or more processors for determining what data to read or write (based on commands from a host device separate from the SoC), and for controlling positions of read and write heads using servo data. An additional controller may be provided to allow any one or more of the aforementioned controller or processor circuits to access working memory (e.g., random access memory or RAM), which may be either onboard the SoC or external to the SoC.

A typical hard disk drive controller SoC would include a transceiver for communicating with a host device. For example, the connection to the host device might be an SATA, SAS or NVMe connection. The same connection would be used for validation, with validation circuitry interposed between the hard disk drive controller SoC and the host device (e.g., a personal computer, or PC). Thus, the validation circuitry would have a corresponding transceiver, as well as testing circuitry configured to put the read data channel on the hard disk drive controller SoC through a series of test commands. For example, the testing circuitry (which might be implemented, e.g., using a field-programmable gate array, or FPGA) could generate signals simulating the command signals that the read data channel might receive in actual operation, including commands instructing the reading and writing of certain data, and the testing circuitry could monitor the responses of the read data channel (RDC) to those simulated commands.

In addition, in many instances, a special protocol may be used for the simulated testing commands and the RDC responses. For example, serializer-deserializer circuitry may be provided on both the drive controller SoC and the testing SoC for serial non-return-to-zero (sNRZ) encoding of the test signals, which is not used during actual run-time operation of the drive controller SoC.

A typical testing arrangement such as that just described involves extra layers in the form of the sNRZ bridge between the two SoCs, the provision of the testing FPGA, and reliance on software running on a host PC, all of which slow down the testing operation, the reporting of results, and the adjustment and optimization of RDC parameters, because of all of the different links between components that must be traversed for even a single adjustment. The parameters, as well as test signals to be simulated, are provided by writing to registers in the RDC. The serial links that must be traversed to write such signals to the registers cannot provide those signals fast enough for real-time simulations. In addition, many of the signals should have small pulse widths, but the lower speed of the serial links result in pulse widths that are much longer than what is needed.

Moreover, the sNRZ connection to the RDC tests only the operation of the RDC itself, while some actual RDC operations involve other SoC components and those operations cannot be tested using an arrangement such as that described above, and therefore might be able to be tested only once the drive controller SoC is integrated into a disk drive.

Therefore, in accordance with implementations of the subject matter of this disclosure, validation circuitry may be built into the hard disk drive controller SoC. This allows the use of native onboard signaling, eliminating the need to convert the test data and test command streams to and from sNRZ, and speeds up the process by eliminating the need for test data and test commands to pass from the controller SoC to the testing SoC to the host PC, and then back. Moreover, because in implementations of the subject matter of this disclosure the validation circuitry sits, during the testing mode (under switchable control), in the place of the control circuitry of the drive controller SoC, the validation circuitry has access to all of the components of the SoC and therefore can test not only the RDC itself but the interactions of the RDC with those other components.

In implementations of the subject matter of this disclosure, the validation circuitry, or "test controller," may include a pattern generator capable of generating simulated read and write commands to the RDC. The test controller also may include a "data pump" including Data Write Direct Memory Access (DMA) circuitry, Data Read DMA circuitry and Servo Read DMA circuitry, which handles the reading and writing of data to and from the RDC, and also determines performance statistics (e.g., RDC errors, and a resultant bit-error rate (BER)) which it passes on to the SoC.

The subject matter of this disclosure may be better understood by reference to FIGS. 1-4.

FIG. 1 illustrates a drive controller SoC 101 in accordance with implementations of the subject matter of this disclosure, which may be used in, e.g., a hard disk drive. Drive controller SoC 101 includes hard drive controller (HDC) circuitry 102 which interfaces with read data channel (RDC) 103 through mode selection multiplexer 104, which is controlled by mode selection input 114. Multiplexer 104 also allows selection of a test controller (TC) 105, described in more detail below, in place of hard drive controller circuitry 102.

Both hard drive controller circuitry 102 and test controller 105 are coupled, via a system bus 106 which may be, in some implementations, an Advanced eXtensible Interface (AXI) bus, to other components of SoC 101. Those other components include input/output (I/O) circuitry including SoC general-purpose I/O circuitry (SoC GPIO) 107 as well as serial port 108, each of which allows communication with external devices. For example, serial port 108 may be used to communicate with a host device 109 (which may be a personal computer), or other instrumentation 110 (e.g., an oscilloscope or other monitoring device) used during diagnostic or test operations, neither of which are part of SoC 101.

Also coupled to bus 106 are a servo processor 111 with tightly-coupled servo memory 112, and data processor 113 with tightly-coupled data memory 115, as well as an interrupt controller 116. In addition, a memory controller 117 (e.g., a dual-data-rate RAM controller) coupled to bus 106 allows data to be stored in external memory such dual-data-rate (DDR) RAM 128, which is not part of SoC 101.

Also not part of SoC 101 is drive medium 119, which may include one or more hard disk platters and associated read/write heads, etc. During normal operation of SoC 101, when mode selection input 114 is not asserted (i.e., is '0'), multiplexer 104 selects hard drive controller circuitry 102 for normal operation of the disk drive of which SoC 101 is a part.

However, when mode selection input 114 is asserted (i.e., is '1'), multiplexer 104 selects test controller 105 in place of hard drive controller circuitry 102. In that configuration, test controller 105 can not only send test signals to RDC 103, but can also interface via bus 106 with all of the components of SoC 101, allowing testing of operations involving not only RDC 103, but also testing of operations in which RDC 103 interacts with those other components.

Providing test controller 105 onboard SoC 101 eliminates the slow serial links described above and allows the simulation and testing of functions having small pulse widths. Similarly, signals can be assigned particular values for particular durations, and with specific timing relationships between signals, which may be necessary in order to successfully validate or test certain functions or operations. Being able to rapidly change signals also allows momentary faults or "glitches" to be simulated.

For example, a signal SPLIT_EN used by RDC 103 may indicate whether a read gate signal (RGATE) corresponds to the start of a new sector, and SPLIT_EN should be stable for the duration of the assertion of the RGATE signal. In one scenario involving a split sector being read during three assertions of the RGATE signal, the SPLIT_EN signal may have a value of 0 for one RGATE interval, followed by a value of 1 for two RGATE intervals. The ability to rapidly change signals facilitates the testing of such a scenario. The ability to rapidly change signals also allows the reaction of RDC 103 to instability in the SPLIT_EN signal to be tested, by, for example, causing the SPLIT_EN signal to change values momentarily—e.g., causing the SPLIT_EN signal to change to '0' for one clock cycle when it should have a stable value of '1' for multiple clock cycles.

As an example of a specific timing relationship between two signals that may be simulated, in order to validate a read operation followed by a write operation, a read enable signal of RDC 103 should transition to '1' (causing the channel to go into read mode), followed by a write enable signal transitioning to '1' (causing the channel to go into write mode), with a minimum gap—e.g., one write clock period—between the two signals. On-board test controller 105 can generate test signals with that precise timing relationship.

Examples of interactions between RDC 103 other components of SOC 101 that can be tested include interactions in which data for configuration registers of RDC 103 are provided via the AXI bus 106 interface, instead of a special serial interface as was previously required. Such interactions could include using RDC 103 as an AXI bus master to send data on AXI bus 106 to write to one of tightly-coupled memories 112, 115 or external DDR memory 128.

As another example, software or firmware running on either servo CPU 111 or data CPU 113 can direct RDC 103, via test controller 105, to perform a temperature measurement using a temperature sensor which may be either inside RDC 103 or outside RDC 103. Similarly, software or firmware running on either servo CPU 111 or data CPU 113 can power down RDC 103 via test controller 105, to emulate a real world power-down event, including controlling the relative timing between power-down signals.

In still another example, test controller 105 can instruct that data be read from drive medium 119 or from arbitrary waveform generator (see FIG. 2) and then streamed out via memory controller 117 to external memory 128. Similarly, test controller 105 can instruct that data be read from external memory 128 under the direction of memory controller 117, and then streamed to RDC 103 which then writes that data to drive medium 119.

Figure 2:
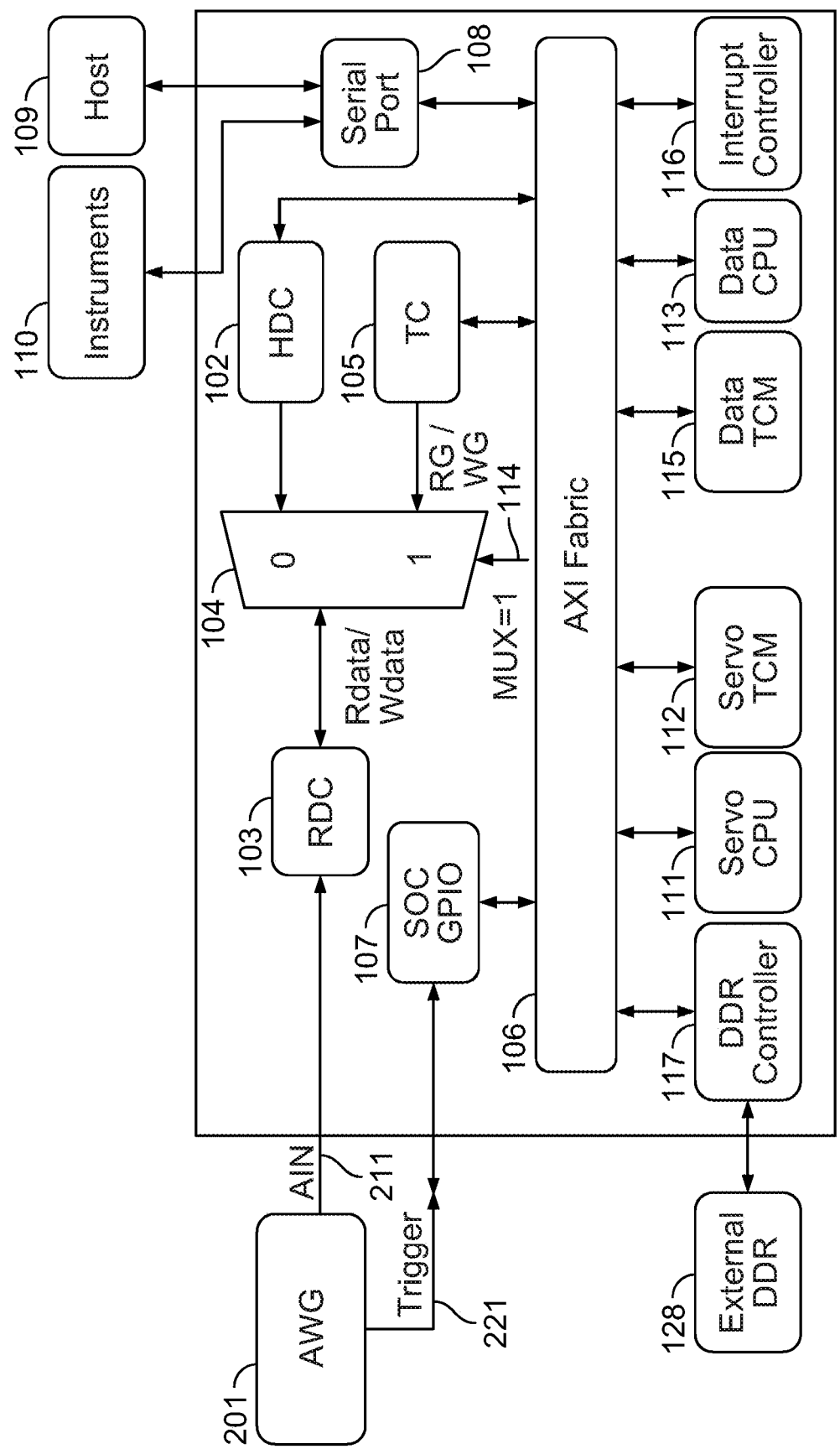
FIG. 2 illustrates the drive controller system-on-chip of FIG. 1 configured for testing in accordance with implementations of the subject matter of this disclosure.

FIG. 2 shows one implementation in which mode selection input 114 is asserted (i.e., is '1'). In this test mode, in place of drive medium 119, an arbitrary waveform generator (AWG) 201 is coupled to RDC 103, supplying an arbitrary input waveform (AIN) 211 to mimic the signal that might be received from a drive medium 119 during actual operation. In addition, AWG 201 sends a trigger signal 221 via SoC general-purpose I/O circuitry 107 to test controller 105 (via bus 106) to advise test controller 105 that AIN signal 211 is being sent. Once TC 105 is aware that AIN signal 211 is being sent, TC 105 can send various control signals (mimicking the signals that might be sent by HDC circuitry 102 during actual operation) to RDC 103, and possibly to other components of SoC 101.

Figure 3:
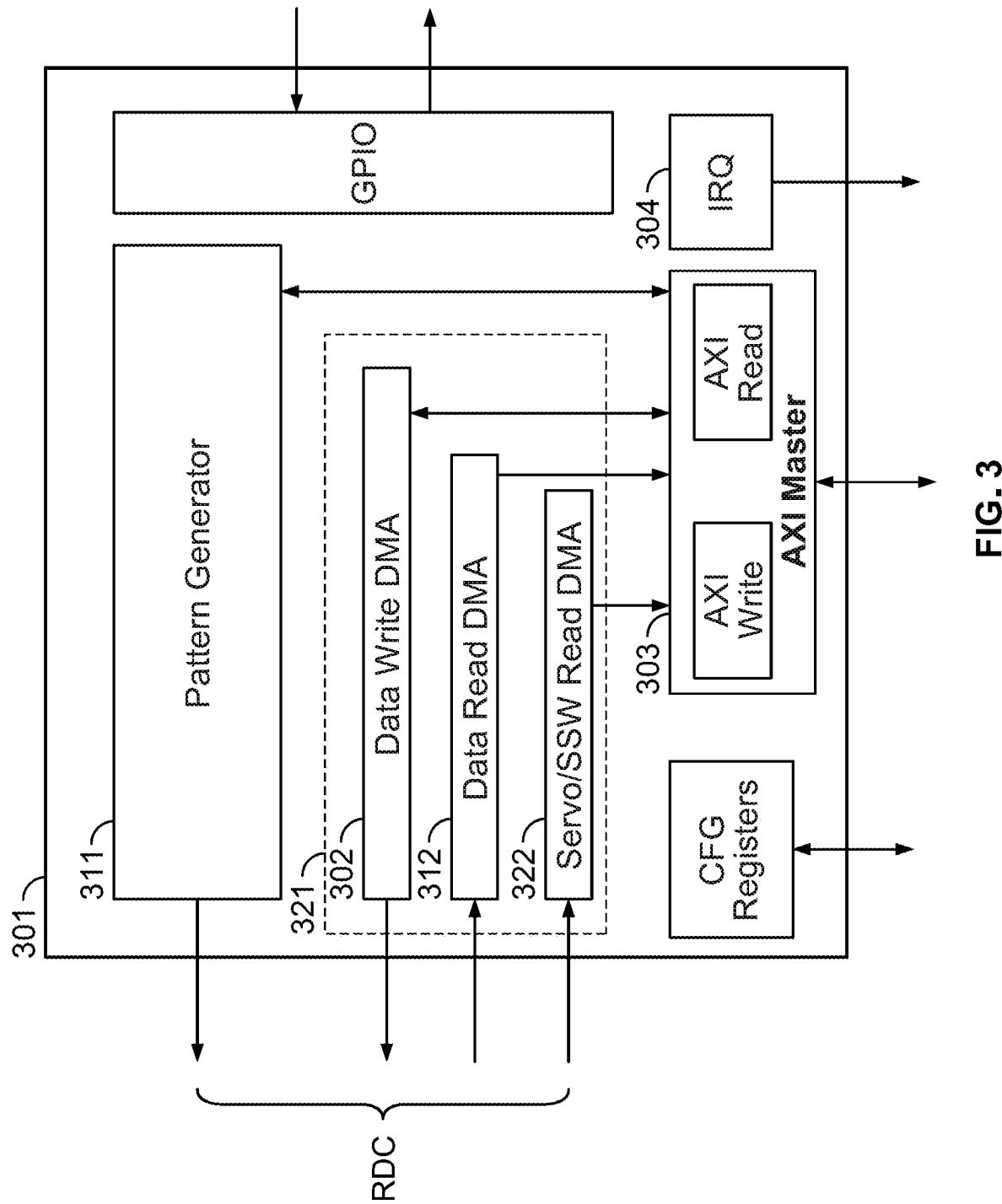
FIG. 3 is a diagram of an implementation of a test controller in accordance with the subject matter of this disclosure.

FIG. 3 is an illustration of an implementation 301 of the structure of TC 105. Test circuitry 301 includes a pattern generator 311 that can generate signals mimicking RDC control signals such as READ_GATE (RG) and WRITE_GATE (WG) signals, READ_DATA (RDATA) and WRITE_DATA (WDATA) signals, etc.). Test circuitry 301 also includes a data pump 321 including data write direct-memory-access (DMA) circuitry 302, data read DMA circuitry 312, and servo/self-servo-write (servo/SSW) read DMA circuitry 322.

Pattern generator 311 is an instruction-based arbitrary vector generator, which may be programmed to generate any desired pattern of gate controls as discussed above (e.g., READ_GATE (RG) and WRITE_GATE (WG) signals, READ_DATA (RDATA) and WRITE_DATA (WDATA) signals, etc.). Therefore, it may be used to simulate any gate control signal, as well as some "data" fields such as those relating to sector size and identification (e.g., HDC_SECTOR_SIZE or SECTOR_TAG).

Because pattern generator 311 is programmable, it may be used to generate not only valid command sequences, but also invalid sequences, to test the response of RDC 103 to invalid commands. The programmed sequences can be created by a user, or by a software or firmware too that creates a vector instruction stream. The instruction stream may be stored in memory onboard SoC 101, such as tightly-coupled data memory 115, or in external memory such as external DDR RAM 128. From either of those storage locations, pattern generator 311 may fetch and execute the stored instruction stream via bus 106.

Data pump 321, including data write direct-memory-access (DMA) circuitry 302, data read DMA circuitry 312, and servo/SSW read DMA circuitry 322, operates as a bridge circuit to bridge data between a standard RDC interface of RDC 103 and the memory where the instruction stream is stored, such as DDR RAM 128. In one direction, data pump 321 receives RDC control signals (RDATA/WDATA/SERVO_NRZ etc.) from bus 106 and relays them to RDC 103. In the other direction, data pump 321 receives data, responsive to the control signals, and transmits the date to DDR RAM 128 (or to another destination) via bus 106, using, e.g., an AXI burst operation via AXI master 303. Triggering and pausing of data pump 321 may be controlled by pattern generator 311.

Interrupt (IRQ) unit 304 of test controller 301 communicates via bus 106 with interrupt controller 116 of SoC 101, issuing interrupts to trigger firmware operations (e.g., in data CPU 113), including setting up RDC 103 in testing modes, performing some real-time service tests, checking test result data (which is stored, e.g., in DDR RAM 128, and computing the bit error rate (BER). The firmware also may communicate test results to host 109 or to instruments 110 (e.g., an oscilloscope) via serial port 108.

As noted above, test controller 301 allows the testing of RDC 103, as well as other components of SoC 101 and their interaction with RDC 103. In addition, test controller 301 allows various RDC control signals to be adjusted to other than their nominal values to determine the effect on RDC operation, and to determine how far from the nominal values the signals can be before they will affect RDC operation.

Figure 4:
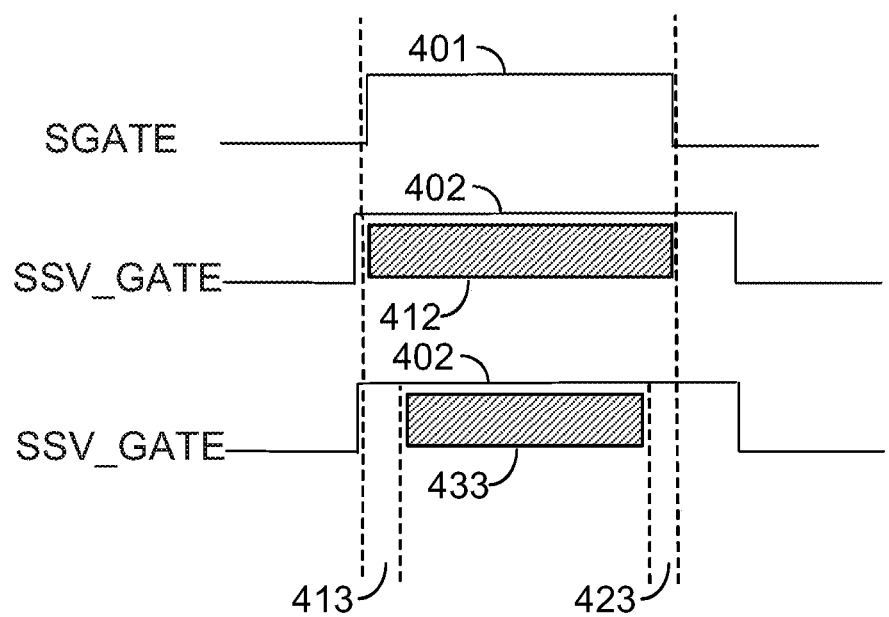
FIG. 4 is an illustration of signaling for servo operations which may be controlled in accordance with implementations of the subject matter of this disclosure.

One such example is shown in FIG. 4, which illustrates the signaling for servo operations. In servo operations, the signal SGATE 401 is asserted for the duration of the servo operation. The signal SSV_GATE, which is another signal that controls servo operations, is nominally required to change state before or at the same time as the assertion of SGATE, and must hold for at least the duration of SGATE but can continue beyond the deassertion of SGATE, as shown at 402, where 412 represents the region where SSV_GATE cannot change.

However, as shown at 403, it may be desirable to add a safety margin 413 to allow SSV_GATE to change slightly after SGATE is asserted, and another safety margin 423 to allow SSV_GATE to change slightly before SGATE is deasserted. Test controller 301 may be programmed to test how large safety margins 413, 423 can be before servo operations in RDC 103 are adversely affected, or, expressed alternatively, to determine the minimum duration 433 during which SSV_GATE cannot be allowed to change.

Figure 5:
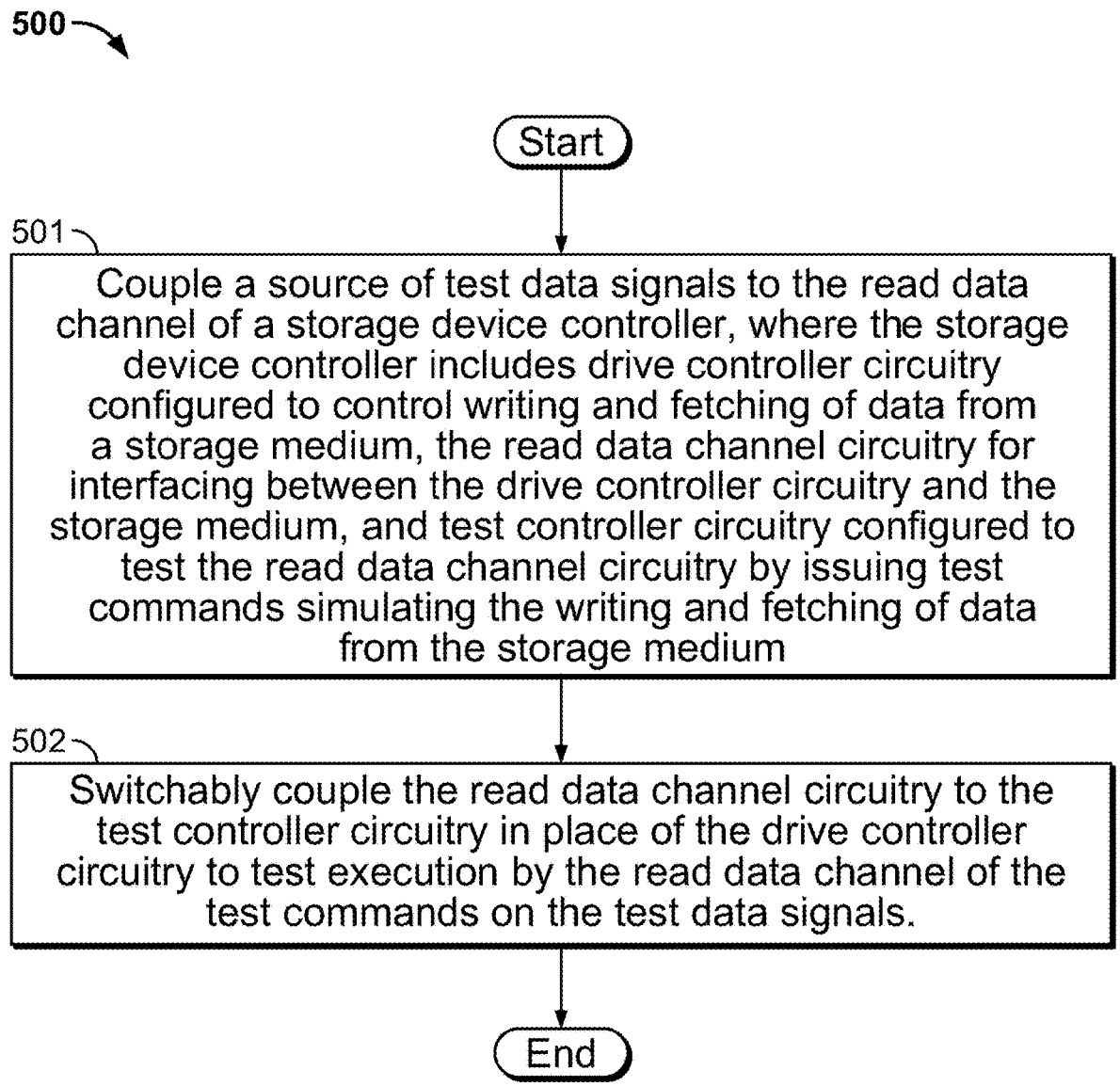
FIG. 5 is a flow diagram illustrating a method in accordance with implementations of the subject matter of this disclosure.

A method 500 according to implementations of the subject matter of this disclosure is diagrammed in FIG. 5.

Method 500 begins at 501 where a source of test data signals is coupled to the read data channel of a storage device controller, where the storage device controller includes drive controller circuitry configured to control writing and fetching of data from a storage medium, the read data channel circuitry for interfacing between the drive controller circuitry and the storage medium, and test controller circuitry configured to test the read data channel circuitry by issuing test commands simulating the writing and fetching of data from the storage medium.

At 502, the read data channel circuitry is switchably coupled to the test controller circuitry in place of the drive controller circuitry to test execution by the read data channel of the test commands on the test data signals. The switchable coupling may be accomplished using a switchable selector such as a multiplexer. The test controller circuitry is used for testing of the read data channel and other components, after which method 500 ends.

Thus it is seen that a system-on-chip, such as a storage device controller, having an onboard test controller to eliminate the need for a separate validation device, and to allow more complete testing of system components, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A storage device controller comprising:
   drive controller circuitry configured to control writing or fetching of data to or from, respectively, a storage medium;
   read data channel circuitry for interfacing between the drive controller circuitry and the storage medium;
   test controller circuitry, separate from the drive controller circuitry, and configured to test the read data channel circuitry by issuing test commands simulating the writing or fetching of data to or from, respectively, the storage medium; and
   selector circuitry configured to couple the read data channel circuitry to the drive controller circuitry in an operating mode and to the test controller circuitry in a testing mode.

2. The storage device controller of claim 1 wherein the test controller circuitry comprises:
   a pattern generator configured to output the test commands; and
   data pump circuitry configured to transfer the data, that is to be written to or fetched from the storage medium, to and from the read data channel circuitry.

3. The storage device controller of claim 2 further comprising processor circuitry configured to create instructions for the test commands.

4. The storage device controller of claim 3 wherein the processor circuitry is configured to store the instructions for the test commands in memory accessible to the test controller circuitry.

5. The storage device controller of claim 4 further comprising onboard memory configured to store the instructions.

6. The storage device controller of claim 4 wherein the processor circuitry is configured to store the instructions for the test commands in memory that is external to the storage device controller.

7. The storage device controller of claim 4 further comprising a bus, wherein at least the read data channel circuitry, the test controller circuitry, the processor circuitry and the memory accessible to the test controller circuitry are coupled to the bus.

8. The storage device controller of claim 7 further comprising a serial interface coupled to the bus, for communicating with a host device.

9. The storage device controller of claim 8 wherein the processor circuitry is configured to store test results in the memory accessible to the test controller circuitry.

10. The storage device controller of claim 9 wherein the processor circuitry is configured to:
   compute performance metrics from the stored test results; and
   communicate the performance metrics to the host device.

11. A method for testing a read data channel of a storage device controller, where the storage device controller includes drive controller circuitry configured to control writing or fetching of data to or from, respectively, a storage medium, read data channel circuitry for interfacing between the drive controller circuitry and the storage medium, and test controller circuitry separate from the drive controller circuitry and configured to test the read data channel circuitry by issuing test commands simulating the writing or fetching of data to or from, respectively, the storage medium, the method comprising:
   coupling a source of test data signals to the read data channel; and
   coupling the read data channel circuitry to the test controller circuitry instead of to the separate drive controller circuitry to test execution by the read data channel of the test commands on the test data signals.

12. The method of claim 11 wherein coupling the read data channel circuitry to the test controller circuitry instead of to the separate drive controller circuitry comprises inputting a control signal to selector circuitry that is coupled to the read data channel circuitry, the test controller circuitry, and the separate drive controller circuitry.

13. The method of claim 11 further comprising sending a trigger signal from the source of test signals to the test controller circuitry to indicate presence of the test signals.

14. The method of claim 11 comprising:
   generating test commands in a pattern generator of the test controller circuitry; and
   inputting the test commands to the read data channel.

15. The method of claim 14 wherein generating the test commands comprises creating instructions for the test commands in processor circuitry of the storage device controller.

16. The method of claim 15 comprising storing the instructions for the test commands in memory accessible to the test controller circuitry.

17. The method of claim 16 wherein storing the instructions for the test commands comprises storing the instructions for the test commands in onboard memory of the storage device controller.

18. The method of claim 16 wherein storing the instructions for the test commands comprises storing the instructions for the test commands in memory that is external to the storage device controller.

19. The method of claim 16 further comprising storing test results in the memory accessible to the test controller circuitry.

20. The method of claim 19 further comprising:
   computing performance metrics from the stored test results; and
   communicating the performance metrics to a host device.

* * * * *

UNITED STATES PATENT AND TRADEMARK OFFICE
CERTIFICATE OF CORRECTION

PATENT NO. : 11,841,396 B1
APPLICATION NO. : 17/655706
DATED : December 12, 2023
INVENTOR(S) : Sameer Vaidya et al.

It is certified that error appears in the above-identified patent and that said Letters Patent is hereby corrected as shown below:

On the Title Page

At (54), in the Title, "UNITED STATES" should be deleted;

In the Specification

Column 1, Line 1, "UNITED STATES" should be deleted.

Signed and Sealed this
Thirteenth Day of February, 2024

Katherine Kelly Vidal
*Director of the United States Patent and Trademark Office*